(12) United States Patent
Thiyagarajan et al.

(10) Patent No.: US 7,745,077 B2
(45) Date of Patent: *Jun. 29, 2010

(54) COMPOSITION FOR COATING OVER A PHOTORESIST PATTERN

(75) Inventors: Muthiah Thiyagarajan, Bridgewater, NJ (US); Yi Cao, Clinton, NJ (US); Sung Eun Hong, Basking Ridge, NJ (US); Ralph R. Dammel, Flemington, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/141,307

(22) Filed: Jun. 18, 2008

(65) Prior Publication Data

US 2009/0317739 A1    Dec. 24, 2009

(51) Int. Cl.
    *G03F 7/30* (2006.01)
(52) U.S. Cl. ............... 430/14; 430/313; 430/330; 430/331
(58) Field of Classification Search ............... 430/14, 430/313, 330, 331
    See application file for complete search history.

(56) References Cited

U.S. PATENT DOCUMENTS

| | | | |
|---|---|---|---|
| 3,104,205 A | 9/1963 | Hainer et al. | |
| 3,666,473 A | 5/1972 | Colom et al. | |
| 4,521,404 A | 6/1985 | Lorenz et al. | |
| 4,595,737 A | 6/1986 | Straub et al. | |
| 4,812,551 A | 3/1989 | Oi et al. | |
| 4,823,345 A | 4/1989 | Daniel et al. | |
| 5,035,881 A | 7/1991 | Mori et al. | |
| 5,073,233 A * | 12/1991 | Banks et al. | 216/48 |
| 5,294,444 A | 3/1994 | Nakamura et al. | |
| 5,538,820 A | 7/1996 | Fisher | |
| 5,547,812 A | 8/1996 | Collins et al. | |
| 5,585,219 A | 12/1996 | Kaimoto et al. | |
| 5,626,836 A | 5/1997 | Liu et al. | |
| 5,750,680 A | 5/1998 | Kim et al. | |
| 5,803,707 A | 9/1998 | Schips et al. | |
| 5,820,491 A | 10/1998 | Hatch et al. | |
| 5,830,964 A | 11/1998 | Liu et al. | |
| 5,843,624 A | 12/1998 | Houlihan et al. | |
| 5,858,620 A | 1/1999 | Ishibashi et al. | |
| 5,863,707 A | 1/1999 | Lin | |
| 5,955,606 A | 9/1999 | Kim et al. | |
| 6,051,678 A | 4/2000 | Kim et al. | |
| 6,080,707 A | 6/2000 | Glenn et al. | |
| 6,090,772 A | 7/2000 | Kaiser et al. | |
| 6,136,499 A | 10/2000 | Goodall et al. | |
| 6,262,222 B1 | 7/2001 | Kim et al. | |
| 6,274,286 B1 | 8/2001 | Hatakeyama et al. | |
| 6,319,853 B1 | 11/2001 | Ishibashi et al. | |
| 6,365,322 B1 | 4/2002 | Padmanaban et al. | |
| 6,376,157 B1 | 4/2002 | Tanaka et al. | |
| 6,447,980 B1 | 9/2002 | Rahman et al. | |
| 6,555,607 B1 | 4/2003 | Kanda et al. | |
| 6,579,657 B1 | 6/2003 | Ishibashi et al. | |
| 6,727,034 B1 | 4/2004 | Ogiso et al. | |
| 6,811,817 B2 | 11/2004 | Sugeta et al. | |
| 6,818,258 B2 | 11/2004 | Kaneko et al. | |
| 6,864,035 B2 * | 3/2005 | Imai | 430/270.1 |
| 6,916,590 B2 | 7/2005 | Kaneko et al. | |
| 7,141,177 B2 | 11/2006 | Tanaka | |
| 7,189,449 B2 | 3/2007 | Osanai et al. | |
| 7,189,499 B2 * | 3/2007 | Sugeta et al. | 430/324 |
| 7,226,726 B2 | 6/2007 | Kanda | |
| 7,252,783 B2 * | 8/2007 | Weir et al. | 252/180 |
| 7,314,691 B2 * | 1/2008 | Hata et al. | 430/14 |
| 7,335,464 B2 | 2/2008 | Takano et al. | |
| 7,399,582 B2 | 7/2008 | Takahashi et al. | |
| 2001/0044070 A1 | 11/2001 | Uetani et al. | |
| 2002/0192591 A1 | 12/2002 | Komatsu et al. | |
| 2003/0008968 A1 * | 1/2003 | Sugeta et al. | 524/556 |
| 2003/0091732 A1 | 5/2003 | Kanda | |
| 2003/0102285 A1 | 6/2003 | Nozaki et al. | |
| 2003/0129538 A1 | 7/2003 | Sheu et al. | |
| 2003/0143490 A1 | 7/2003 | Kozawa et al. | |
| 2004/0109958 A1 | 6/2004 | Nigam et al. | |
| 2004/0110099 A1 | 6/2004 | Kozawa et al. | |
| 2004/0121259 A1 | 6/2004 | Kozawa et al. | |

(Continued)

FOREIGN PATENT DOCUMENTS

EP    1 223 470 A1    7/2002

(Continued)

OTHER PUBLICATIONS

English Language Abstract of JP 1-221750 A.

(Continued)

*Primary Examiner*—John S Chu
(74) *Attorney, Agent, or Firm*—Sangya Jain

(57) ABSTRACT

The present invention relates to an aqueous coating composition for coating a photoresist pattern, comprising a polymer comprising at least one unit with an alkylamino group, where the unit has a structure (1),

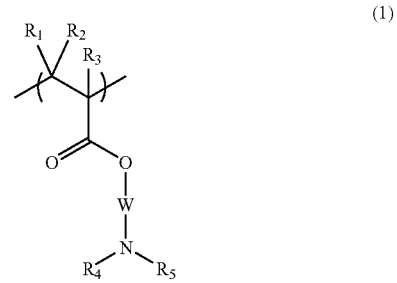

(1)

where, $R_1$ to $R_5$ are independently selected from hydrogen and $C_1$ to $C_6$ alkyl, and W is $C_1$ to $C_6$ alkyl. The invention also relates to a process for imaging a photoresist layer using the present composition.

19 Claims, 1 Drawing Sheet

U.S. PATENT DOCUMENTS

| | | | |
|---|---|---|---|
| 2005/0123851 | A1 | 6/2005 | Shinbori et al. |
| 2005/0175926 | A1 | 8/2005 | Sugeta et al. |
| 2005/0227151 | A1 | 10/2005 | Hata et al. |
| 2005/0245663 | A1 | 11/2005 | Sugeta et al. |
| 2006/0073419 | A1 | 4/2006 | Kozawa et al. |
| 2006/0088788 | A1 | 4/2006 | Kudo et al. |
| 2006/0099347 | A1 | 5/2006 | Sugeta et al. |
| 2006/0160015 | A1 | 7/2006 | Takano et al. |
| 2006/0183218 | A1 | 8/2006 | Takahashi et al. |
| 2006/0211814 | A1 | 9/2006 | Nishikawa et al. |
| 2006/0258809 | A1 | 11/2006 | Sugeta et al. |
| 2007/0059644 | A1 | 3/2007 | Takahashi et al. |
| 2007/0213447 | A1 | 9/2007 | Sugeta et al. |
| 2007/0259106 | A1 | 11/2007 | Shimizu et al. |
| 2008/0044759 | A1 | 2/2008 | Ishibashi et al. |
| 2008/0193880 | A1 | 8/2008 | Nishibe et al. |
| 2008/0248427 | A1 | 10/2008 | Thiyagarajan et al. |

FOREIGN PATENT DOCUMENTS

| | | | |
|---|---|---|---|
| EP | 1 602 983 A1 | 7/2005 | |
| EP | 1 757 989 A1 | 2/2007 | |
| GB | 2 305 175 A | 4/1997 | |
| GB | 2 320 500 A | 6/1998 | |
| JP | 36-22145 | 11/1961 | |
| JP | 1-221750 A | 9/1989 | |
| JP | 3-200805 A | 9/1991 | |
| JP | 5-241348 A | 9/1993 | |
| JP | 6-81173 A | 3/1994 | |
| JP | 6-250379 A | 9/1994 | |
| JP | 7-191214 A | 7/1995 | |
| JP | 9-235318 A | 9/1997 | |
| JP | 9-244262 A | 9/1997 | |
| JP | 9-325502 A | 12/1997 | |
| JP | 10-73927 A | 3/1998 | |
| JP | 5-166717 A | 11/2009 | |
| WO | WO 98/14832 A1 | 4/1998 | |
| WO | WO 00/17712 A1 | 3/2000 | |
| WO | WO 00/67072 A1 | 11/2000 | |
| WO | WO 02/48260 A2 | 6/2002 | |
| WO | WO 2006/019135 A1 | 2/2006 | |
| WO | WO 2007/013230 A1 | 2/2007 | |
| WO | WO 2009/091361 A1 | 7/2009 | |

OTHER PUBLICATIONS

English Language Abstract of JP 3-200805 A.
English Language Abstract of JP 5-241348 A.
English Language Abstract of JP 6-250379 A.
English Language Abstract of JP 6-81173 A.
English Language Abstract of JP 9-235318 A.
English Language Abstract of JP 9-244262 A.
English Language Abstract of JP 9-325502 A.
English Language Translation of Claim for JP 36-22145.
Complete set of specification papers for U.S. Appl. No. 10/089,704, filed Oct. 4, 2000 with cover page.
Office Action dated Dec. 30, 2008 for U.S. Appl. No. 11/697,804.
International Search Report (Form PCT/ISA/210) for PCT/JP00/06940.
Notification of Transmittal of the International Search Report and the Written Opinion of the International Searching Authority, or the Declaration (Form PCT/ISA/220); International Report (Form PCT/ISA/210); and Written Opinion of the International Searching Authority (Form PCT/ISA/237) for PCT/IB2006/003347.
Substantive/Modified Substantive Examination and Search Report (in English) for Malaysian patent application No. PI 20013263.
English Translation (and original language document) of Pre-Notification of Reasons for Possible Rejection of the Pending Patent Examination dated Mar. 19, 2004; of Decision on Examination dated May 20, 2004; and of Pre-Notification of Reasons for Possible Rejection of the Pending Patent Re-Examination dated Nov. 3, 2005 for Taiwanese patent application No. 90111701.
English language translation (and original language document) of Notice of the First Office Action dated Apr. 1, 2005 and of Notice of the Second Office Action dated Mar. 24, 2006 for Chinese patent application No. 01802203.0.
Official Action (in Chinese and English Translation thereof) from State Intellectual Property Office of P.R. China for Application No. 02817955.2.
W.E. Feely, J.C. Imhof and C.M. Stein, Polymer Engineering and Science, vol. 26, No. 16, pp. 1101-1104 (Mid-Sep. 1983).
H. Ito and C.G. Wilson, Polymer Engineering and Science, vol. 23, No. 18. pp. 1012-1018 (Dec. 1983).
Kodama et al., "Synthesis of Novel Fluoropolymer for 157nm Photoresists by Cyclo-polymerization", Proc. SPIE vol. 5690, p. 76-pp. 83 (2002).
Mori, CAPLUS AN1994:617650.
Skofronick et al CAPLUS AN 1969:492865.
Tran et al., "Metal-Catalized Vinyl Addition Polymers for 157 nm Resist Applications. 2. Fluorinated Norbornenes: Synthesis, Polymerization, and Initial Imaging Results", Macromolecules vol. 35, pp. 6539-pp. 6549 (2002).
Notification of Transmittal of the International Search Report and the Written Opinion of the International Searching Authority, or the Declaration (Form PCT/ISA/220), Searching Authority, or the Declaration (Form PCT/ISA/220), and Written Opinion of the International Searching Authority (Form PCT/ISA/237) for PCT/IB2008/000908 dated Jun. 19, 2009, which corresponds to U.S. Appl. No. 11/697,804.
U.S. Appl. No. 12/451,150, filed Oct. 27, 2009, Sung-Eun Hong et al. Form PCT/ISA/220, Form PCT/ISA/210, and Form PCT/ISA/237 for PCT/IB2009/005975 dated Sep. 22, 2009, which corresponds to this patent application.
Machine Language English Abstract and Translation from JPO of JP 2008-255124 A, which is equivalent of WO 2007/013230 A1.
English Language Abstract of WO 2007/013230 A1 from Database CAPLU Sentered Feb. 1, 2007, Chemical Abstracts Service, AN 2007:114002 (XP-002545404).
International Search Report (Form PCT/ISA/210) for PCT/JP2008/058341 dated Nov. 13, 2008, which corresponds to U.S. Appl. No. 12/451,150.
Form PCT/IB/326, Form PCT/IB/373, and PCT/ISA/237 for PCT/IB2008/000908 dated October 22, 2009, which corresponds to U.S. Appl. No. 11/697,804.

* cited by examiner

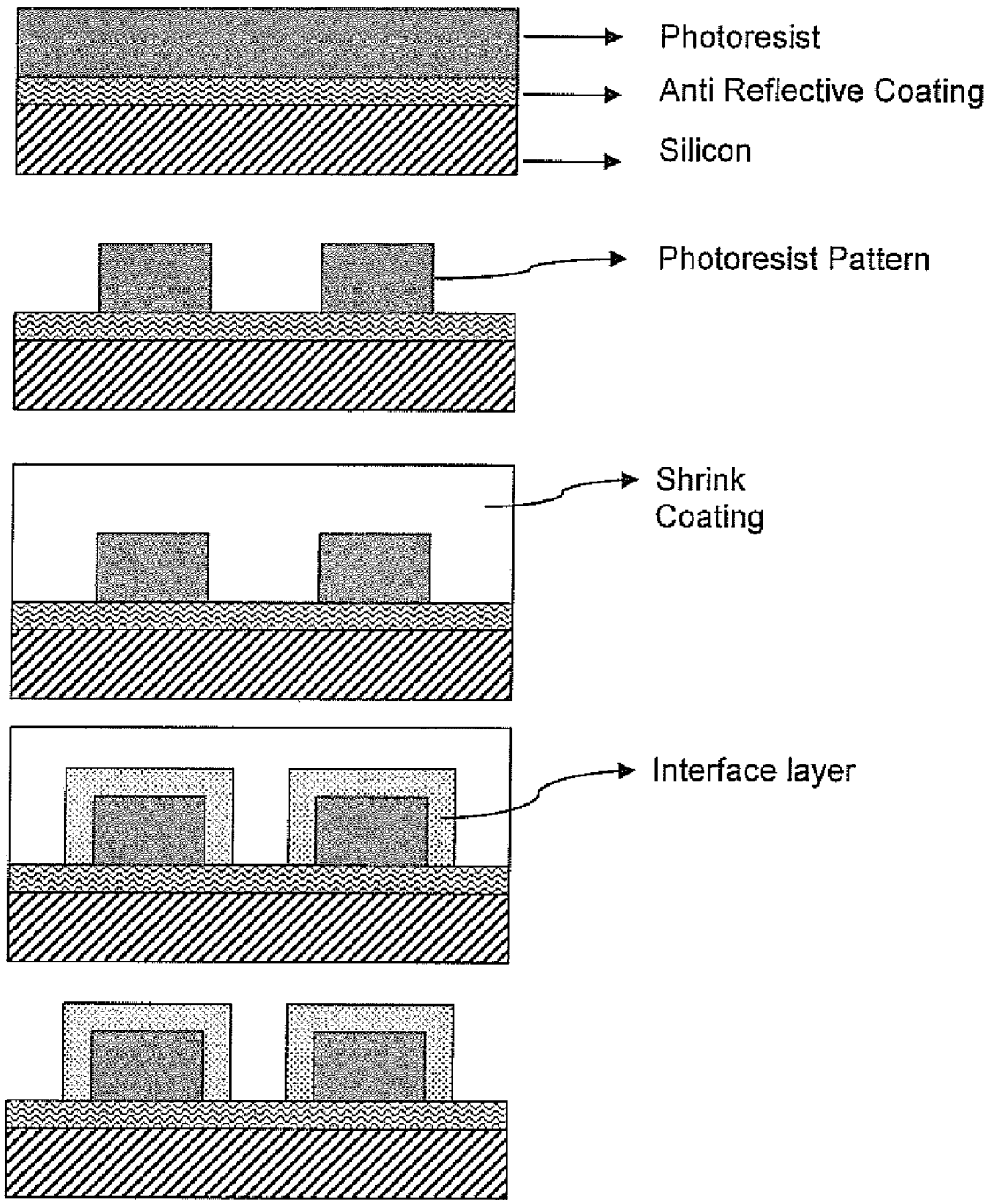
Figure 1: Illustration of the Shrink Process

COMPOSITION FOR COATING OVER A PHOTORESIST PATTERN

TECHNICAL FIELD

The present invention relates to a composition for coating over a photoresist pattern to improve lithographic performance and also relates to a process for using such a coating for making an image on a substrate.

BACKGROUND ART

The densification of integrated circuits in semiconductor technology has been accompanied by a need to manufacture very fine interconnections within these integrated circuits. Ultra-fine patterns are typically created by forming patterns in a photoresist coating using photolithographic techniques. Generally, in these processes, a thin coating of a film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation. This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

Miniaturization of integrated circuits requires the printing of narrower and narrower dimensions within the photoresist. Various technologies have been developed to shrink the dimensions to be printed by the photoresist, examples of such technologies are, multilevel coatings, antireflective coatings, phase-shift masks, photoresists which are sensitive at shorter and shorter wavelengths, etc.

One important process for printing smaller dimensions relies on the technique of forming a thin layer on top of the photoresist pattern, thus widening the photoresist image and reducing the dimension of the space between adjacent photoresist features. This narrowed space can be used to etch and define the substrate or be used to deposit materials, such as metals. This bilevel technique allows much smaller dimensions to be defined as part of the manufacturing process for microelectronic devices, without the necessity of reformulating new photoresist chemistries. The top coating layer or shrink material may be an inorganic layer such as a dielectric material, or it may be organic such as a crosslinkable polymeric material.

Dielectric shrink materials are described in U.S. Pat. No. 5,863,707, and comprise silicon oxide, silicon nitride, silicon oxynitride, spin on material or chemical vapor deposited material. Organic polymeric coatings are described in U.S. Pat. No. 5,858,620, where such coatings undergo a crosslinking reaction in the presence of an acid, thereby adhering to the photoresist surface, but are removed where the top shrink coating has not been crosslinked. U.S. Pat. No. 5,858,620 discloses a method of manufacturing a semiconductor device, where the substrate has a patterned photoresist which is coated with a top layer, the photoresist is then exposed to light and heated so that the photogenerated acid in the photoresist diffuses through the top layer and can then crosslink the top layer. The extent to which the acid diffuses through the top coat determines the thickness of the crosslinked layer. The portion of the top layer that is not crosslinked is removed using a solution that can dissolve the polymer.

BRIEF DESCRIPTION OF DRAWING

FIG. 1 illustrates the imaging process using the shrink material.

SUMMARY OF INVENTION

The present invention relates to an aqueous coating composition for coating a photoresist pattern, comprising a polymer comprising at least one unit with an alkylamino group, where the unit has a structure (1),

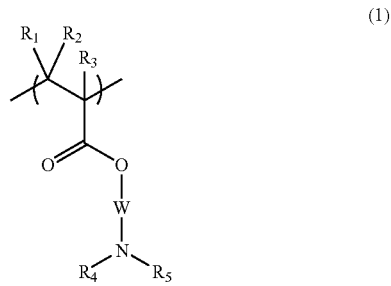

where, $R_1$ to $R_5$ are independently selected from hydrogen and $C_1$ to $C_6$ alkyl, and W is $C_1$ to $C_6$ alkylene. The invention also relates to a process for imaging a photoresist layer using the present novel composition.

DESCRIPTION OF THE INVENTION

The present invention relates to a coating composition of a shrink coating material comprising a water soluble polymer comprising alkylamino (—N(alkyl$_1$)(alkyl$_2$)) groups, that is, the pendant nitrogen attached to the polymer is alkylated with (alkyl$_1$) and (alkyl$_2$) groups and free of hydrogen. A polymer which is water soluble and comprises the alkylamino group is particularly useful for coating over photoresists sensitive in the deep ultraviolet, especially at 248 nm, 193 nm and 157 nm, where the photoresist polymer comprises groups that can react with the alkylamino group. The reactive groups in the photoresist polymer can be groups such as those selected from carbonyl (C=O) and hydroxyl. The object of the invention is to form a coating over the imaged photoresist pattern which reacts with the photoresist and stabilizes the photoresist pattern and further increases the dimensional thickness of the photoresist such that narrow spaces can be defined. It has been unexpectedly found that the use of this novel coating shrink composition leads to improved pattern definition, higher resolution, low defects, smaller feature sizes, less temperature sensitivity and stable pattern formation of imaged photoresist.

The present invention relates to a novel aqueous shrink coating composition comprising a water soluble polymer containing at least one alkylamino group. The polymer is dissolved in a water based solvent composition. The composition may be free of additives, such as crosslinking agents, photoacid generators, aminoalcohol compounds, amide compounds, amidoacrylate compounds, and acrylate compounds. The composition may contain the novel polymer, and optionally a surfactant, dissolved in water. The invention also relates to a process for manufacturing a microelectronic device for reducing the critical dimensions of the patterned photoresist substrate, comprising forming a layer of the novel shrink coating composition on top of an imaged photoresist pattern, reacting a portion of the shrink composition near the photoresist interface, and removing the unreacted, soluble portion of the shrink material with a removal solution.

FIG. 1 illustrates the process for using the shrink material to reduce the spaces between the photoresist patterns, where the photoresist is coated over an antireflective coating, imaged, and then coated with the shrink material composition. The substrate is heated to form an interface layer. The unreacted shrink layer is removed, thus forming a photoresist/interface layer pattern with a narrower space than with the photoresist alone.

The novel aqueous shrink coating composition for coating a photoresist pattern, comprises a water soluble polymer or essentially a water soluble polymer comprising at least one alkylamino group, where the monomeric unit comprising the alkylamino group has a structure (1),

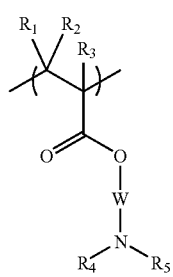

(1)

where, $R_1$ to $R_5$ are independently selected from hydrogen and $C_1$ to $C_6$ alkyl, and W is $C_1$ to $C_6$ alkylene. W is free of a carbonyl (C=O) group. W may be a branched or linear $C_1$ to $C_6$ alkylene. In one embodiment W may be selected from ethylene, propylene and butylene. In another embodiment $R_4$ and $R_5$ may be independently selected from methyl, ethyl, propyl and butyl. In yet another embodiment of the monomeric unit (1) in the polymer, $R_1$ and $R_2$ are hydrogen, $R_3$ is hydrogen or methyl, W is ethyl or propyl, and $R_4$ and $R_5$ may be selected from methyl, ethyl, propyl and butyl. Examples of monomers that may be used to form the monomeric unit of structure (1) are dimethylaminoethyl acrylate, dimethylaminoethyl methacrylate and dimethylaminopropylmethacrylate.

The polymer may be a homopolymer of the monomeric unit of structure (1). The polymer may also comprise at least one monomeric unit of structure (1) and at least one other comonomeric unit. The comonomeric unit may be a vinyl monomer. In one embodiment of the polymer in the novel composition, the polymer may comprise a unit of structure (1) and at least one unit of structure (2),

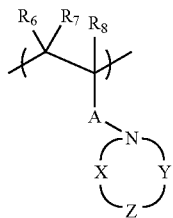

(2)

where, $R_6$ to $R_8$ are independently selected from hydrogen and $C_1$ to $C_6$ alkyl, A is selected from a single bond, O, C(O), (C=O)O, and $C_1$ to $C_4$ alkyl, and X, Y, Z and N (nitrogen) combine to form a cyclic structure, further where, X is selected from $C_1$ to $C_6$ alkylene, unsaturated $C_1$ to $C_6$ alkylene, direct bond, and mixtures thereof, Y is selected from $C_1$ to $C_6$ alkylene, unsaturated $C_1$ to $C_6$ alkylene, direct bond, and mixtures thereof, Z is selected from O, C=O, and N.

The nitrogen containing ring in structure 2, may comprise one or more saturated bonds, one or more unsaturated bonds, be aromatic or mixtures thereof. The unsaturated bond may be a double bond. Alkylene is generally referred to as linear or branched within the present invention. Examples of the nitrogen containing cyclic group may be without limitation imidazole, N-pyrrolidone, caprolactam, N-morpholine, piperdine, aziridine and triazine.

Further examples of monomeric units of structure 2 are monomeric units of structure (2a) and (2b),

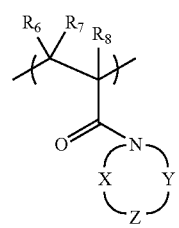

(2a)

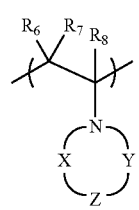

(2b)

where $R_6$ to $R_8$ are independently selected from hydrogen and $C_1$ to $C_6$ alkyl, and moiety defined by X, Y, Z are as above in structure 2. The nitrogen containing cyclic moiety of structures 2a and 2b, may comprise one or more saturated bonds in the cyclic structure, one or more unsaturated bonds in the cyclic structure, be an aromatic ring, or mixtures thereof. Examples of the cyclic moiety are imidazole, N-pyrrolidone, caprolactam, N-morpholine, piperdine, aziridine and triazine. Further examples of units of structure (2) are,

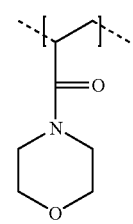

2(c)

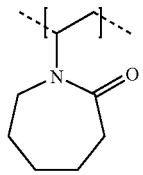

2(d)

-continued

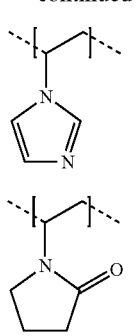

2(e)

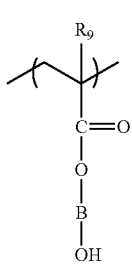

2(f)

In one embodiment of the polymer, the polymer may comprise at least one monomeric unit of structure (1) as above, optionally a monomeric unit of structure (2) as above, and a third monomeric unit of structure (3), $$\begin{array}{c} R_9 \\ | \\ \text{—CH}_2\text{—C—} \\ | \\ C=O \\ | \\ O \\ | \\ B \\ | \\ OH \end{array}$$ (3)

where $R_9$ is H or $C_1$ to $C_6$ alkyl and B is $C_1$ to $C_6$ alkylene. B may be a branched or linear $C_1$ to $C_6$ alkylene. The group B may be ethylene, propylene or butylene, and $R_9$ may be hydrogen or methyl. One example of a monomer which provides the unit of structure 3 is hydroxyethymethacrylate.

The monomer which provides the monomeric unit of structure (1) may be copolymerized with other vinyl monomers, such as exemplified without limitation by those of structure 2 and 3 and also exemplified by N-vinyl pyrrolidone, acrylic acid, vinyl alcohol, methacrylic acid, N-vinylimidizole, acrylamide, allylamine, vinyl triazines, 2-vinyl-4,6-diamino-1,3, 5-triazine, diallylamine, vinylamine; N-acryloylmorpholine, piperidinyl methacrylate; and bifunctional monomers such as ethyleneglycoldiacrylate, and ethyleneglycoldimethacrylate. The polymer may comprise a mixture of several monomeric units.

In one embodiment of the polymer, the polymer is free of pendant acrylate groups and/or amide groups. The polymer does not use monomers such as (meth)acrylamide in the synthesis of the present inventive polymer. In one embodiment of the composition, the composition contains 1) the novel polymer comprising structure 1 and is free of any amide groups, such as monomeric units derived from (meth)acrylamide, 2) optionally a surfactant, and 3) water.

In one embodiment of the novel water soluble polymer, the polymer is polymerized from mixtures of at least one of 2-dimethylaminoethyl methacrylate, and at least one of acryloyl morpholine, N-vinyl caprolactam, and N vinyl pyrrolidone. In another embodiment the copolymers containing the alkylamino group are exemplified by poly(2-dimethylaminoethyl methacrylate-co-vinyl amine), poly(2-dimethylaminoethyl methacrylate-co-allyl amine), poly(2-dimethylaminoethyl methacrylate-co-diallyl amine), poly(2-dimethylaminoethyl methacrylate-co-acryloyl morpholine), poly(2-dimethylaminoethyl methacrylate-co-N-vinyl caprolactam) and poly(2-dimethylaminoethyl methacrylate-co-piperidinyl methacrylate).

The polymer comprising the alkylamino group in one embodiment is free of any aromatic moiety or absorbing chromophore, such as groups containing phenyl moiety. The polymer or the composition does not absorb the radiation used to image the photoresist which is coated beneath the shrink layer. The composition may be free of a photoacid generator such that the composition is not photoimageable.

The water soluble polymer can be made by any polymerization technique. Bulk or solution polymerization may be used. Typically the vinyl monomers are polymerized using a polymerization initiator, such as azo or peroxide initiators. Examples of peroxide initiators are acetyl peroxide, benzoyl peroxide, lauryl peroxide, cumenehydroperoxide, etc. Examples of azo initiators are azobisisobutyronitrile (AIBN), 2,2'-diamidino-2,2'-azodipropane dihydrochloride, 2,2'-azobis[2-(2-imidazolin-2-yl)propane]dihydrochloride, 2,2'-azobis(2-amidino propane)dihydrochloride, 2,2'-azobis[2-(2-imidazolin-2-yl)propane]dihydrochloride and examples of persulfates are such as ammonium persulfates and potassium persulfates. The polymerization can be carried out in the presence of a solvent, examples of which are acetonitrile, methanol, ethanol, isopropanol, 2-butanone and water, preferably for some reactions, isopropanol is used. The reaction can be carried out for a suitable amount of time and at a suitable temperature. The reaction time can range from about 3 hours to about 18 hours. The reaction temperature can range from about 40° C. to about 80° C. The weight average molecular weight of the polymer for the shrink coating material ranges from approximately 3,000 to 100,000, preferably from Mw 5,000 to 100,000, and more preferably from 10,000 to 50,000, but any polymer with the appropriate molecular weight may be used.

In the copolymer of the present composition, the unit of structure 1 may range from about 20 mole % to about 80 mole %; the unit of structure 2 when used in the polymer may range from about 30 mole % to about 80 mole %; the unit of structure 3 when used in the polymer may range from about 20 mole % to about 60 mole %. The copolymer may also comprise the unit of structure 1 in the range from about 20 mole % to about 60 mole % and the unit of structure 2 in the range from about 40 mole % to about 80 mole %. The copolymer may also comprise the unit of structure 1 in the range from about 20 mole % to about 60 mole % and the unit of structure 3 in the range from about 40 mole % to about 60 mole %.

The shrink coating material composition of the present invention comprises the novel water soluble polymer containing the alkylamino (—N(R$_4$)R$_5$) group and water, where the polymer concentration ranges from about 1 weight % to about 20 weight %, preferably 2-10 weight %, and more preferably 2-6 weight % of the composition, depending on the physical parameters of the polymer and the different chemical compositions of the polymer. Additives and/or other solvents that are miscible with water may be added to the composition, such as crosslinking agents, water soluble surfactants, alcohols, aminoalcohols, amines, surfactants, thermal acid generators, free acids, photoacid generators, and water soluble polymers other than those containing an alkylamine or amido group. In the formulation of the shrink material, water miscible solvents can be used in order to get a uniform coating. The water miscible organic solvents used are exemplified by ($C_1$-$C_8$) alcohols such as methyl alcohol, ethyl alcohol, isopropyl alcohol, diols (such as glycols) and triols (such as glycerol); ketones such as acetone, methyl ethyl ketone, 2 heptanone, cyclohexanone; esters such as methyl acetate and ethyl acetate; lactates such as methyl lactate and ethyl lactate, lactones such as gamma-butyrolactone; amides such as N,N-dimethyl acetamide; ethylene glycol monoalkyl ethers such as ethylene glycol monomethyl ether, and ethylene glycol monoethyl ether; ethylene glycol monoalkyl ether acetate such as ethylene glycol monomethyl ether acetate, ethylene glycol monoethyl ether acetate; other solvents such as N-methyl pyrrolidone, propylene glycol monomethyl ether, propylene glycol monoethyl ether, propylene glycol monomethyl ether acetate, propylene glycol monoethyl ether acetate. Solvents such as ($C_1$-$C_8$) alcohols, particularly, isopropanol, methyl alcohol, ethyl alcohol may be added. The solvent may be added to the composition at up to about 30 weight % or up to 20 weight % of the total composition.

Some additives which are added to the shrink material composition comprising the polymer and water can be exemplified by aminoalcohols, such as monoethanolamine, diethanolamine, triethanolamine, 2-(2-aminoethoxy)ethanol, N,N-dimethylethanolamine, N,N-diethanolamine, N-methyldiethanolamine, monoisopropylamine, diisopropylamine and triisopropylamine; amines such as polyalkylenepolyamines, 2-ethylhexylamine, dioctylamine, tripropylamine, tributylamine, triallylamine; and cyclic amines such as piperazine, piperidine, 1,4-Diazabicyclo[2.2.2]octane, N-methylpiperazine and hydroxyethylpiperazine. Crosslinking agents such as any known crosslinker may be used as an additive, like glycolurils, melamines, urea/formaldehyde polymers, etc. In one embodiment, the coating composition does not contain a crosslinking agent, especially melamine and urea based crosslinking agents. Crosslinking agents are not necessary for the reaction between the polymer of the top coat and the photoresist polymer, since it is believed but not bound by theory, that the present invention involves a base induced reaction of the functionality in the photoresist polymer with the novel polymer of the present invention. Therefore, in one embodiment the shrink material composition is free of crosslinking agents. Surfactants, if necessary, may be added to the shrink composition to enable better film forming properties. Examples of surfactants are cationic compounds, anionic compounds and nonionic polymers. Examples of surfactants are Surfynols® sold by Air Products Corp., which are acetylene alcohols. Others can be acetylene glycols, polyethoxylated acetylene alcohols and polyethoxylated acetylene glycols. Other water soluble polymers may be added to the composition, such as polyvinyl alcohol, partially acetal capped polyvinyl alcohol, polyallylamine, polyacrylic acid, polymethacrylic acid, poly(vinylpyrrolidone-co-vinyl alcohol), poly(vinylpyrrolidone-co-vinyl melamine), etc. These polymers may be added at up to 30 weight % of the solids. Free acids such as p-toluenesulphonic acid, perfluorobutanesulphonic acid, perfluorooctanesulphonic acid, (±) camphorsulphonic acid and dodecylbenzenesulphonic acid may be added to the composition.

Any known thermal acid generators and photoacid generators that are water soluble may be added alone or as mixtures to the novel composition. Suitable examples of acid generating photosensitive compounds include, without limitation, ionic photoacid generators (PAG), such as diazonium salts, iodonium salts, sulfonium salts. The thermal acid generator (TAG) used in the present invention may be any that upon heating generates an acid which can cleave the acid cleavable bond present in the invention, particularly a strong acid such as a sulfonic acid. Preferably, the thermal acid generator is activated at 90° C. and more preferably at above 120° C., and even more preferably at above 150° C. The photoresist film is heated for a sufficient length of time to react with the coating. The free acid, photoacid generator and/or the thermal acid generator, may be incorporated in a range from about 0.1 to about 10 weight % by total solids of the composition, preferably from 0.3 to 5 weight % by solids, and more preferably 0.5 to 2.5 weight % by solids.

In one embodiment of the novel composition, the composition and/or the polymer is free of amides. In another embodiment of the invention the composition is free of amides and additives, that is, the composition contains the present inventive polymer and an aqueous solvent composition. The polymer comprising structure (1) is crosslinkable and does not require an additional crosslinking agent.

In another embodiment of the novel composition, the polymer in the composition is free of the carboxylic acid group. The composition may also be free of carboxylic acids, amido groups and additives, that is, the composition contains the polymer and a solvent composition comprising water. The polymer comprising structure (1) is crosslinkable and does not require a crosslinking agent.

An imaged pattern of photoresist is formed on a substrate according to processes well-known to those skilled in the art. Photoresists can be any of the types used in the semiconductor industry. There are two types of photoresist compositions, negative-working and positive-working. When negative-working photoresist compositions are exposed image-wise to radiation, the areas of the photoresist composition exposed to the radiation become insoluble to a developer solution while the unexposed areas of the photoresist coating remain relatively soluble to such a solution. Thus, treatment of an exposed negative-working photoresist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Photoresist resolution is defined as the smallest feature which the photoresist composition can transfer from the photomask to the substrate with a high degree of image edge acuity after exposure and development. In addition, it is almost always desirable that the developed photoresist wall profiles be near vertical relative to the substrate. Such demarcations between developed and undeveloped areas of the photoresist coating translate into accurate pattern transfer of the mask image onto the substrate. This becomes even more critical as the push toward miniaturization reduces the critical dimensions on the devices.

Generally, a photoresist comprises a polymer and a photosensitive compound. Examples of photoresist systems, without limitation, are novolak/diazonaphthoquinone, polyhydroxystyrene/onium salts, capped polyhydroxystyrene/onium salts, cycloaliphatic polymers/onium salts, cycloaliphatic acrylate polymers/onium salts, and fluoropolymers/onium salts, etc. These photoresists are well-known for use at wavelengths ranging from 436 nm to 13 nm. Any type of photoresist that is capable of forming an image may be used. Generally, a photoresist is coated on a substrate, and the photoresist coating is baked to remove substantially all of the coating solvent. The coating is then exposed with the appropriate wavelength of light, and developed with a suitable developer.

Suitable device substrates include, without limitation, silicon, silicon substrate coated with a metal surface, copper coated silicon wafer, copper, aluminum, polymeric resins, silicon dioxide, metals, doped silicon dioxide, silicon nitride, silicon carbide, tantalum, polysilicon, ceramics, aluminum/copper mixtures, glass, coated glass; gallium arsenide and other such Group III/V compounds. The substrate may comprise any number of layers made from the materials described above. Generally one or more layers of an antireflective coating are coated over the device substrate and the photoresist is coated over the antireflective coating(s).

The photoresist layer is formed by coating the photoresist composition over the substrate. Photoresists sensitive to deep ultraviolet radiation, typically 248 nm, 193 nm, and 157 nm are preferred. The photoresist is imaged through a mask and optionally baked. The photoresist is then developed, typically with an aqueous alkaline developer such as tetramethyl ammonium hydroxide solution. The imaging process of a photoresist is known in the art.

Once a photoresist pattern is defined on the substrate, the novel shrink material of the present invention is coated over the substrate with the photoresist pattern and reacted with the surface of the photoresist to form an interface layer which is insoluble in the aqueous removing solution. A rinsing solution can remove the shrink material that has not reacted to form the interface layer. The interface layer is formed by heating the shrink material coated photoresist pattern at a suitable temperature for a suitable time. The interface layer will increase the width of the photoresist pattern. Thus the space between two adjacent photoresist features will become smaller after the formation of the interface layer, and this narrower space can be used to define smaller features than the photoresist alone. FIG. 1 illustrates the process of using the shrink composition.

The novel shrink material of the present invention is coated over the patterned photoresist and reacted with the photoresist. The thickness of the reacted shrink interface layer can range from about 10 nm to about 500 nm, preferably 10 nm to 100 nm and more preferably 10 nm to 60 nm. The reaction between the shrink coating material and the photoresist to form the interface layer typically occurs during the heating step. The shrinkage of the photoresist opening or hole can be calculated as a percentage reduction of the photoresist opening, that is, shrinkage %=(original photoresist opening dimension−dimension of the opening with the reacted interface layer)×100/original photoresist opening dimension. Opening is the space between two adjacent photoresist walls. The opening can be trench or a hole in the photoresist pattern. The shrinkage % can range from about 10% to about 60% or about 10% to about 45% or about 10% to about 35%. The substrate may be heated between 80° C. and 200° C., preferably 90° C. and 190° C., and more preferably between 100° C. and 180° C. for 30 seconds to 180 seconds on a hotplate to react the shrink layer and form the interface layer over the photoresist.

The residual portion of the shrink material that is not reacted with the photoresist to form the interface layer is removed using a removal solution. The removal solution may be water or comprises an aqueous solution of a surfactant, which may further comprise an alkali and/or a water-miscible solvent. Examples of an alkali are tetramethyl ammonium hydroxide, tetraethyl ammonium hydroxide, choline or mixtures thereof. Water-miscible solvents as also described previously are, for example, lower aliphatic alcohols such as ethanol or isopropanol; multifunctional alcohols such as ethylene glycol, propylene glycol, glycerol, or their monomethyl ethers, in particular propylene glycol monomethyl ether (PGME). Water-soluble nonionic surfactants and anionic surfactants were found to provide good lithographic results. Examples of nonionic surfactants are ethylene oxide/propylene oxide polymers, terminated by alkyl, fluoroalkyl, or aromatic groups. Anionic surfactants also gave superior lithographic performance, and examples of such surfactants are, salts of longer-chain alkanoic acids, such as laurates, stearates, or heptanoates, salts of alkyl or aralkyl sulfonic acids, such as laurylsulfonic acid, or variously substituted salts of sulfonic acid amides, or the partially or completely fluorinated derivatives of the above classes of compounds. Ammonium, tetramethyl ammonium, tetraethyl ammonium, or other alkyl ammonium ions are useful counter ions. The actual composition of the removal solution is dependent on factors such as, the shrink material, the desired lithographic performance, compatibility of materials, production specifications, etc.

The removal solution is applied on the surface of the substrate in a manner known in the art. Puddle development, immersion development, spray development or any mixtures of these techniques may be used to remove chemical compositions from the substrate. The time and temperature of the removal process is varied to give the best lithographic properties. Desirable lithographic properties being, for example, (a) cleanliness of the substrate after removal of the unreacted shrink material, that is, the substrate is free from insoluble deposits, stringers, bridges, etc, (b) vertical wall angles, and (c) smooth surfaces.

At current resolution targets it is desirable to obtain a space reduction of photoresist features obtained with the interface layer over the photoresist of between of from about 10 nm to about 60 nm, preferably about 20 nm to about 50 nm. The exact space width reduction requirement is highly dependent on the type of microelectronic devices being manufactured.

Once the desired narrow space is formed as defined by the process described above, the device may be further processed as required. Metals may be deposited in the space, the substrate may be etched, the photoresist may be planarized, etc.

Unless otherwise indicated, all numbers expressing quantities of ingredients, properties such as molecular weight, reaction conditions, and so forth used in the specification and claims are to be understood as being modified in all instances by the term "about." Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The molecular weight of the polymers was measured on a Gel Permeation Chromatograph.

The defects were measured using KLA2360 (pixel size 0.25 μm (manufactured by KLA Tencor Co., San Jose, Calif.) in the exposed and unexposed areas after development.

Example 1

Synthesis of Poly(N,N-dimethylaminoethylacrylate-co-N-vinylpyrrolidone)

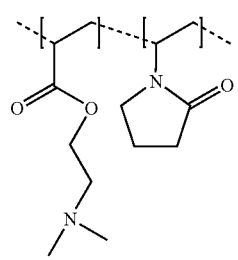

A mixture of N,N-dimethylaminoethylacrylate (DMAEA) (25.70 g, 0.1795 mol), N-vinylpyrrolidone (NVP)) (19.95 g, 0.1795 mol), 6.85 g of initiator, Azo-bisisobutyronitrile (AIBN) and 97.50 g of acetonitrile were added to a 500 ml round bottom flask equipped with water condenser and nitrogen inlet. The initiator concentration was 15 wt % relative to the total weight of the monomers. Other solvents such as isopropylalcohol (IPA), 2-butanone and methanol can also be used instead of acetonitrile. Nitrogen gas was purged into the solution for 30 minutes at room temperature with stirring. After the nitrogen purge, the reaction solution was heated to 65° C. The polymerization reaction was carried out for 6 hours. After the completion of polymerization, the polymer solution was cooled to 30° C. and concentrated using rotary evaporator. The concentrated solution was precipitated in diethyl ether. Other solvents such as diisopropyl ether and tertbutylmethyl ether may also be used. The amount of precipitating solvent used was 7 times that of the initial volume of reaction. The final copolymer was vacuum dried at 40° C. and the yield was 70%. The copolymer (Polymer 3 in Table 1) was characterized by NMR, GPC, and lithographic analysis. The weight average molecular weight of the polymer was 24,832 (Mw) and polydispersity was 4.0.

The above procedure was repeated with the mole % of the monomers being varied, N-vinylpyrrolidone (20-80%), N,N-dimethylaminoethylacrylate (20-80%), as shown in Table 1 for the different polymers (Polymer 1-6) as summarized in Table 1. The molecular weight (Mw) of the polymers were in the range of 15,000-27,000 and its polydispersity was in the range of 2.0-5.0.

$^{13}$C NMR (CD$_3$OD) data for Polymer 3: δ 177.5 ppm (>$\underline{C}$=O, NVP); δ 175.8 ppm (>$\underline{C}$=O, DMAEA); δ62.9 ppm (O—$\underline{C}H_2$, DMAEA); δ58.3 ppm (>N—$\underline{C}H_2$, DMAEA); δ 45.9 ppm (—N—$\underline{C}H_3$, DMAEA); δ 45.6 ppm (—N—$\underline{C}H_2$, NVP); δ 42.0-34.0 ppm (main chain —$\underline{C}H$, $\underline{C}H_2$ of NVP & DMAEA, overlapped); δ 32.2 ppm (O=C—$\underline{C}H_2$, NVP); δ 19.0 ppm (—N—CH$_2$—$\underline{C}H_2$—, NVP)

Lithographic evaluation of poly(DMAEA-co-NVP) on ArF photoresist, AZ®AX2050P: Mixing bake temperature variation for 90 nm C/H with 180 nm pitch.

A bottom anti-reflective coating material (B.A.R.C), AZ® ArF-1C5D (manufactured by AZ® EM USA Corp, 70 Meister Ave., Somerville, N.J.) was spin coated on a silicon substrate and baked at 200° C. for 60 seconds to prepare an antireflective coating layer of 0.037 μm in thickness. Then AZ® AX2050P photoresist solution (a 193 nm photoresist manufactured by AZEM USA Corps, 70, Meister Ave., Somerville, N.J.) was spin-coated on the bottom anti-reflective coated (B.A.R.C) silicon substrate. The photoresist film was baked at 110° C. for 60 seconds to give a thickness of 0.15 μm. Then the photoresist film was exposed on a 193 nm scanner (numerical aperture of 0.78 and coherence of 0.9) using a 6% attenuated phase shift mask. After exposure, the wafer was post-exposure baked at 110° C. for 60 seconds and developed using AZ®626 MIF Developer (manufactured by AZEM USA Corps, 70, Meister Ave., Somerville, N.J.), for 60 seconds, to form a contact hole (C/H) pattern having a diameter of 90 nm with 180 nm pitch (pitch is the distance between the start of the one hole and the start of the second hole). The photoresist patterns were then observed on a scanning electron microscope and the contact hole diameter measured.

A mixture of 2.0 g of poly (N-N,dimethylaminoethylacrylate-co-N-vinylpyrrolidone, Polymer 4 from Table 1) and 0.2878 g of surfactant S-485 (a Surfynol surfactant manufactured by Air Products & Chemicals, Inc. Allentown, Pa.) was dissolved in 48.7194 g of deionized (DI) water to prepare a shrink material composition. The solution was filtered using 0.2 μm filter. The total solid content in the formulation was 4%.

The above described shrink material composition or (RELACS material, Resolution Enhancement Lithography Assisted by Chemical Shrink material) was applied onto the previously photoresist patterned substrate and the thickness of the RELACS or shrink film was 100 nm. The substrate was subjected to heat treatment (i.e. mixing bake) at 150° C. for 60 seconds on a hotplate. Subsequently, the unreacted shrink material was removed using DI water puddle for 60 s and rinsed for 30 s. Different experiments were run using different mixing bake temperatures varying from 120° C.-160° C. for 60 s in order to promote a crosslinking reaction at the interface between the photoresist and RELACS layer without an additive, since the polymer is self crosslinkable. Shrinkage is a measure of critical dimension (CD) difference of the contact hole diameter (C/H) or trench before and after the RELACS (shrink) process. The thicker the shrinkage or shrink interface layer the greater the shrinkage of the photoresist feature, and a larger shrinkage is more desirable. Shrinkage was measured using CD-SEM. The diameter of the hole in the photoresist/RELACS pattern was reduced by up to 24.4 nm from its initial hole diameter in the photoresist pattern. It was found that there is a change in the shrinkage (12 nm-25 nm) when bake temperature is varied from 120° C.-160° C. The lithographic example as shown above was carried out for Polymers 1-6 and the details are summarized in Table 1. Increasing the mixing temperature increased the shrinkage of the hole.

TABLE 1

Polymerization Data and lithographic evaluation of copolymers
(DMAEA/NVP) on AZ ® AX2050P (90 nm 1:1 Contact Hole photoresist)

| | | | Formulation | | | Shrinkage (nm) | | | | |
|---|---|---|---|---|---|---|---|---|---|---|
| | DMAEA | NVP | | *S485 | | | | | | |
| Polymer | (mol %) | (mol %) | Polymer (g) | (g) | H2O (g) | 120° C. | 130° C. | 140° C. | 150° C. | 160° C. |
| 1 | 80 | 20 | 2.0 | 0.28 | 48.72 | 8.5 | 13.4 | 15.3 | 21.0 | 34.6 |
| 2 | 70 | 30 | 2.0 | 0.28 | 48.72 | 8.5 | 12.6 | 14.3 | 20.6 | 48.6 |
| 3 | 50 | 50 | 2.0 | 0.28 | 48.72 | 11.9 | 13.6 | 20.0 | 24.4 | NM |
| 4 | 40 | 60 | 2.0 | 0.28 | 48.72 | 12.6 | 12.8 | 20.0 | 23.7 | NM |
| 5 | 30 | 70 | 2.0 | 0.28 | 48.72 | 14.0 | 17.1 | 19.4 | 23.4 | 47.1 |
| 6 | 20 | 80 | 2.0 | 0.28 | 48.72 | 14.7 | 18.0 | 19.8 | 22.3 | 39.8 |

*S485: Surfactant 5 wt % in DI Water (manufactured by AIR products & Chemicals, Inc.);
NM: Not Measured.

Example 2

Synthesis of Poly(N,N-dimethylaminoethylacrylate-co-acryloylmorpholine)

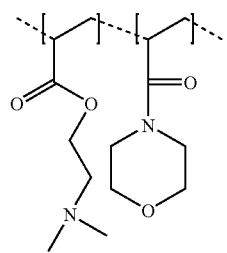

A mixture of N,N-dimethylaminoethylacrylate (30.69 g, 0.2144 mol), acryloylmorpholine (AMOR) (45.39 g, 0.3215 mol), 11.41 g of initiator, azo-bisisobutyronitrile (AIBN) and 162.5 g of acetonitrile were added to a 500 ml round bottom flask. After a nitrogen purge, the reaction solution was heated to 70° C. The polymerization reaction was carried out for 7 hrs. The concentrated polymer solution was precipitated in diisopropylether. The amount of precipitating solvent used was 8 times that of initial volume of reaction. The final copolymer (Polymer 9) was vacuum dried at 40° C. and the yield was 75%. The copolymer was characterized by NMR, GPC, and lithographic analysis. The weight average molecular weight of the polymer was 19,340 (Mw) and polydispersity was 4.0.

The synthesis was repeated by varying the mole % of the monomers, dimethylaminoethylacrylate (20-60%), acryloylmorpholine (40-80%), for the different polymers is summarized in Table 3 (Polymers 7-11). The molecular weight (Mw) of the polymers was in the range of 15,000-33,000 and the polydispersity was in the range of 2.0-5.0.

$^{13}$C NMR (CD$_3$OD) for Polymer 9: δ 174.2 ppm (>$\underline{C}$=O, AMOR); δ 176.3 ppm (>$\underline{C}$=O, DMAEA); δ61.9 ppm (O—$\underline{C}$H$_2$, DMAEA); δ 58.4 ppm (O—CH$_2$—$\underline{C}$H$_2$—, DMAEA); δ 45.9 ppm (—N—$\underline{C}$H$_3$, DMAEA); δ 48.1 ppm (—N—CH$_2$—$\underline{C}$H$_2$—O, AMOR); δ 40.0-34.0 ppm (main chain — $\underline{C}$H, $\underline{C}$H$_2$ of AMOR & DMAEA, overlapped); δ 43.5 ppm ((—N—$\underline{C}$H$_2$—CH$_2$—O, AMOR)

The lithographic evaluation was carried out for Polymers 7-11 as shown in Example 1, and the details are summarized in Table 2. Increasing the mixing temperature increased the shrinkage of the hole.

TABLE 2

Polymerization Data and lithographic evaluation of copolymers
(DMAEA/AMOR) on AZ ® AX2050P (90 nm 1:1 CH resist)

| | | | Formulation | | | Shrinkage (nm) | | | | | |
|---|---|---|---|---|---|---|---|---|---|---|---|
| | DMAEA | AMOR | Polymer | *S485 | | | | | | | |
| Polymer | (mol %) | (mol %) | (g) | (g) | H2O (g) | 120° C. | 130° C. | 140° C. | 150° C. | 160° C. | 170° C. |
| 7 | 60 | 40 | 2.0 | 0.28 | 48.72 | 8.5 | 9.8 | 13.8 | 14.7 | 17.8 | 22.6 |
| 8 | 50 | 50 | 2.0 | 0.28 | 48.72 | 13.9 | 16 | 18.2 | 18.1 | 21.5 | 49.6 |
| 9 | 40 | 60 | 2.0 | 0.28 | 48.72 | 13.5 | 17.1 | 19.1 | 19.5 | 25.1 | 45.8 |
| 10 | 30 | 70 | 2.0 | 0.28 | 48.72 | 14 | 14.8 | 17.8 | 20.6 | 25.3 | 38.9 |
| 11 | 20 | 80 | 2.0 | 0.28 | 48.72 | 10.8 | 11.4 | 14.1 | 17.4 | 21.5 | 28.9 |

*S485: Surfactant 5 wt % in DI Water (manufactured by AIR products & Chemicals, Inc.);

Example 3

Synthesis of Poly(acryloylmorpholine-co-N,N-dimethylaminoethylacrylate-co-vinylcaprolactam)

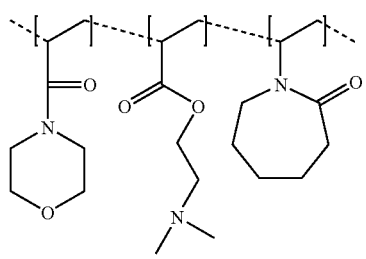

$^{13}$C NMR (CD$_3$OD) for Polymer 22a: δ 178.8 ppm (> C═O, VCL); δ 174.4 ppm (>C═O, AMOR); 176.6 ppm (> C═O, DMAEA); δ62.5 ppm (O—CH$_2$—CH$_2$—N, DMAEA); δ58.3 ppm (O—CH$_2$—CH$_2$—N, DMAEA); δ 68.3 ppm (—N—CH$_2$, VCL); δ 46.2 ppm (—N—CH$_3$, DMAEA); δ 48.1 ppm (—N—CH$_2$—CH$_2$—O, AMOR); δ 43.8 ppm (—N—CH$_2$—CH$_2$—O, AMOR); δ 40.0-34.0 ppm (main chain —CH, CH$_2$ of AMOR, VCL & DMAEA, overlapped); δ 31.1 ppm (O═C—CH$_2$—, VCL); δ 24.3 ppm ((—N—CH$_2$—CH$_2$—CH$_2$—CH$_2$—, VCL).

The lithographic evaluation was carried out for Polymers 12-22d as shown in Example 1 and the details are summarized in Table 3. Increasing the mixing temperature increased the shrinkage of the hole.

TABLE 3

Polymerization Data and Shrinkage performance of poly(AMOR/DMAEA/VCL) without additive on AZ 2050P (90 nm 1:1 Contact Hole photoresist)

| Polymer | AMOR (mol %) | DMAEA (mol %) | VCL (mol %) | Formulation Polymer (g) | *Additive (g) | H2O (g) | Shrinkage (nm) 120° C. | 130° C. | 140° C. | 150° C. | 160° C. | 170° C. |
|---|---|---|---|---|---|---|---|---|---|---|---|---|
| 12 | 50 | 40 | 10 | 1.8 | 0.0 | 58.92 | 11.3 | 11.1 | 16.0 | 14.4 | 15.8 | 23.8 |
| 13 | 50 | 30 | 20 | 1.8 | 0.0 | 58.92 | 13.4 | 14.5 | 12.8 | 15.7 | 19.4 | 27.3 |
| 14 | 50 | 20 | 30 | 1.8 | 0.0 | 58.92 | 12.5 | 13.0 | 13.7 | 16.0 | 19.3 | 33.8 |
| 15 | 80 | 10 | 10 | 1.8 | 0.0 | 58.92 | NM | NM | NM | NM | NM | NM |
| 16 | 40 | 43 | 17 | 1.8 | 0.0 | 58.92 | NM | NM | NM | NM | NM | NM |
| 17 | 30 | 24 | 46 | 1.8 | 0.0 | 58.92 | NM | NM | NM | 22.3 | NM | NM |
| 18 | 30 | 46 | 24 | 1.8 | 0.0 | 58.92 | NM | NM | NM | 16.8 | NM | NM |
| 19 | 30 | 60 | 10 | 1.8 | 0.0 | 58.92 | 17.9 | 20.2 | 37.2 | NM | NM | NM |
| 20 | 54 | 23 | 23 | 1.8 | 0.0 | 58.92 | 18.1 | 19.4 | 30.1 | 18.7 | NM | NM |
| 21 | 30 | 10 | 60 | 1.8 | 0.0 | 58.92 | 13.7 | 17.5 | 25.0 | 24.1 | NM | NM |
| 22a | 30 | 38 | 32 | 1.8 | 0.0 | 58.92 | 17.9 | NM | 20.2 | NM | 37.2 | NM |
| 22b | 30 | 38 | 32 | 1.8 | 0.9 | 58.10 | 18.1 | NM | 19.4 | NM | 30.1 | NM |
| 22c | 30 | 38 | 32 | 1.8 | 1.8 | 57.26 | 13.7 | NM | 17.5 | NM | 25.0 | NM |
| 22d | 30 | 38 | 32 | 1.8 | 2.7 | 56.43 | 8.9 | NM | 13.6 | NM | 32.2 | NM |

*Additive: N-(2-aminoethyl)ethanolamine, 20 wt % in DI water;
NM: Not Measured.

A mixture of acryloylmorpholine (22.81 g, 0.1615 mol), N,N-dimethylaminoethylacrylate (29.30 g, 0.2046 mol), vinylcaprolactam (VCL) (23.98 g, 0.1723 mol), 11.41 g of initiator, Azo-bisisobutyronitrile(AIBN) and 162.50 g of acetonitrile were added to a 500 ml round bottom flask. The experimental setup, reaction conditions and isolation process after the reaction were the same as in Example 2. The final copolymer (Polymer 22a) was vacuum dried at 40° C. and the yield was 78%. The copolymer was characterized by NMR, GPC, and lithographic analysis. The weight average molecular weight of the polymer was 64,401 (Mw) and polydispersity was 6.0.

The mole % of the monomers, dimethylaminoethylacrylate (10-60%), acryloylmorpholine (30-80%), vinylcaprolactam (10%-60%) for the different polymers (Polymers 12-22d) is summarized in Table 3. The molecular weight (Mw) of the polymers was in the range of 16,000-65,000 and the polydispersity was in the range of 2.0-6.0.

Example 4

Synthesis of Poly(acryloylmorpholine-co- N,N-dimethylaminoethylmethacrylate-co-vinylcaprolactam

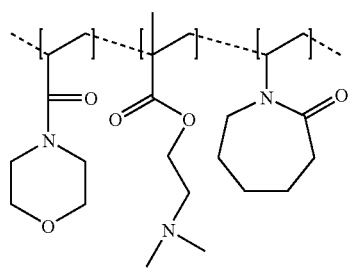

A mixture of acryloylmorpholine (40.17 g, 0.2845 mol), N,N-dimethylaminoethylmethacrylate (19.05 g, 0.1212 mol), vinylcaprolactam (16.87 g, 0.1212 mol), 11.41 g of initiator, Azo-bisisobutyronitrile (AIBN) and 162.50 g of acetonitrile were added to a 500 ml round bottom flask. The experimental setup, reaction condition and isolation process after the reaction was the same as in Example 2. The final copolymer (Polymer 26) was vacuum dried at 40° C. and the yield was 73%. The copolymer was characterized by NMR, GPC, and lithographic analysis. The weight average molecular weight of the polymer was 23,043 (Mw) and polydispersity was 3.0.

The mole % of the monomers, dimethylaminoethylacrylate (23-60%), acryloylmorpholine (30-54%), vinylcaprolactam (10%-60%) for the different polymers (Polymers 23-28) is summarized in Table 4. The weight average molecular weight (Mw) of the polymers was in the range of 20,000-40,000 and the polydispersity was in the range of 2.0-7.0.

$^{13}$C NMR (CD$_3$OD) for Polymer 26: δ 178.5 ppm (>C=O, VCL); δ 174.0 ppm (>C=O, AMOR); 176.2 ppm (>C=O, DMAEA); δ62.3 ppm (O—CH$_2$—CH$_2$—N, DMAEA); δ58.6ppm (O—CH$_2$—CH$_2$—N, DMAEA); δ 68.0 ppm (—N—CH$_2$, VCL); δ 46.4 ppm (—N—CH$_3$, DMAEA); δ 48.3 ppm (—N—CH$_2$—CH$_2$—O, AMOR); δ 43.6 ppm (—N—CH$_2$—CH$_2$—O, AMOR); δ 40.3-34.2 ppm (main chain —CH, CH$_2$ of AMOR, VCL & DMAEA, overlapped); δ 31.5 ppm (O=C—CH$_2$—, VCL); δ 24.1 ppm ((—N—CH$_2$—CH$_2$—CH$_2$—CH$_2$—, VCL), δ 20.0 ppm ((—CH$_3$—, main chain, DMAEMA).

The lithographic evaluation was carried out for Polymers 23-28 as shown in Example 1 and the details are summarized in Table 4. Increasing the mixing temperature increased the shrinkage of the hole.

A mixture of N,N-dimethylaminoethylmethacrylate (55.09 g, 0.3847 mol), vinylimidazole (36.21 g, 0.3847 mol), 13.7 g of initiator, azo-bisisobutyronitrile (AIBN) and 195 g of acetonitrile were added to a 500 ml round bottom flask. After nitrogen purge, the reaction solution was heated to 65° C. The polymerization reaction was carried out for 7 hrs. The experimental setup and isolation process were the same as Example 2. The final copolymer (Polymer 29) was vacuum dried at 40° C. and the yield was 75%. The copolymers were characterized by NMR, GPC, and lithographic analysis. The weight average molecular weight of the polymer was 18,350 (Mw) and polydispersity was 2.2.

$^{13}$C NMR (CD$_3$OD) for Polymer 34: δ 175.4 ppm (>C=O, DMAEA); δ138.3 ppm (CH—N—CH—N—CH—, imidazole group); δ130.3 ppm (CH—N—CH—N—CH—, imidazole group); δ118.3 ppm (CH—N—CH—N—CH—, imidazole group); δ62.7ppm (O—CH$_2$, DMAEA); δ58.5 ppm (>N—CH$_2$, DMAEA); δ 45.7 ppm (—N—CH$_3$, DMAEA); δ 42.0-34.0 ppm (main chain —CH, CH$_2$ of VI & DMAEA, overlapped).

The formulation using Polymer 29 was the same as example 4 (1.8 g polymer and 58.9 g water). Photoresist and RELACS lithographic process conditions were the same as Example 1. The composition with Polymer 29 without any additive showed a hole shrinkage of 8.4 nm at mixing temperature of 120° C., 12.0 nm at mixing temperature of 130° C., 15.4 nm at mixing temperature of 140° C., 18.3 nm at mixing temperature of 150° C. and 19.9 nm at mixing temperature of 160° C. for 90 nm 1:1 contact hole.

TABLE 4

Polymerization Data and Shrinkage performance of poly(AMOR/DMAEA/VCL) on AZ 2050P (90 nm 1:1 Contact Hole photoresist) at 140° C. and 150° C. mixing bake.

| Polymer | AMOR (mol %) | DMAEMA (mol %) | VCL (mol %) | Formulation | | Shrinkage (nm) | |
|---|---|---|---|---|---|---|---|
| | | | | Polymer (g) | H2O (g) | 140° C. | 150° C. |
| 23 | 30 | 24 | 46 | 1.8 | 58.9 | 18.1 | 21.9 |
| 24 | 30 | 46 | 24 | 1.8 | 58.9 | 12.1 | 19.0 |
| 25 | 30 | 60 | 10 | 0.0 | 0.0 | NM | NM |
| 26 | 54 | 23 | 23 | 1.8 | 58.9 | 18.9 | 22.5 |
| 27 | 30 | 10 | 60 | 1.8 | 58.9 | 19.9 | 24.1 |
| 28 | 30 | 38 | 32 | 1.8 | 58.9 | 15.3 | 21.3 |

NM: Not Measured.

Example 5

Synthesis of Poly(N,N-dimethylaminoethylmethacrylate-co-vinylimidazole)

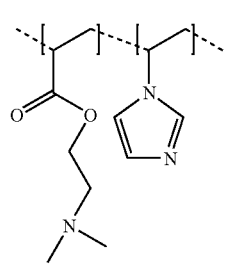

Example 6

Synthesis of Poly(hydroxyethylmethacrylate-co-N,N-dimethylaminoethylmethacrylate)

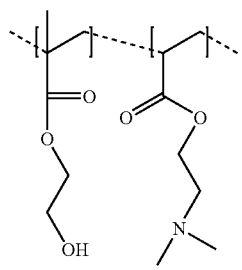

A mixture of hydroxyethylmethacrylate (36.23 g, 0.2784 mol), N,N-dimethylaminoethylmethacrylate (39.86 g, 0.2784 mol), 11.41 g of initiator, azo-bisisobutyronitrile (AIBN) and 162.5 g of isopropylalcohol (IPA) were added in a 500 ml round bottom flask. The reaction solution was precipitated in diethyl ether. The experimental setup, reaction condition and isolation process were same as Example 6. The final copolymer (Polymer 30) was vacuum dried at 40° C. and the yield was 75%. The copolymer was characterized by NMR, GPC, and lithographic analysis. The weight average molecular weight of the polymer was 16,248 (Mw) and polydispersity was 2.0.

$^{13}$C NMR (CD$_3$OD) of Polymer 30: δ 175.4 ppm (>C═O, DMAEA); δ 167.2 ppm (>C═O, HMEA), δ67.5 ppm (O—CH$_2$, HEMA), δ60.6ppm (HO—CH$_2$, HEMA); δ62.5 ppm (O—CH$_2$, DMAEA); δ58.2 ppm (>N—CH$_2$, DMAEA); δ 45.8 ppm (—N—CH$_3$, DMAEA); δ 42.0-34.0 ppm (main chain —CH, CH$_2$ of VI & DMAEA, overlapped). δ 19.1 ppm (—CH$_3$, main chain, HEMA).

The formulation using Polymer 30 was the same as example 4, (1.8 g polymer and 58.9 g water). Photoresist and RELACS lithographic process conditions were the same as Example 1. Composition with Polymer 30 without any additive showed a hole shrinkage of 17.5 nm at mixing temperature of 140° C. for 90 nm 1:1 contact hole.

Example 7a

Defect Inspection of Poly(DMAEA-co-NVP/(40/60)), by KLA

An anti-reflective coating material, AZ® ArF-1C5D (manufactured by AZEM USA Corps, 70 Meister Ave., Somerville, N.J.) was spin coated on a silicon substrate and baked at 200° C. for 60 s to prepare an anti-reflective coating of 0.037 μm in thickness. Then AZ® AX2050P photoresist solution (manufactured by AZEM USA Corps, 70, Meister Ave., Somerville, N.J.) was spin-coated on the bottom antireflective coated (B.A.R.C) silicon substrate. The photoresist film was baked at 110° C. for 60 seconds to give a thickness of 0.15 μm. Then the photoresist film was exposed on a 193 nm scanner (numerical aperture of 0.78 and coherence of 0.9) using a 6% attenuated phase shift mask. After exposure, the wafer was post-exposure baked at 110° C. for 60 sec. and developed using AZ®626 MIF Developer (manufactured by AZEM USA Corps, 70 Meister Ave., Somerville, N.J.), for 60 sec., to form a contact hole pattern having a diameter of 90 nm with 180 nm pitch. The photoresist patterns were then observed on a scanning electron microscope.

The shrink coating material made as in Table 1 using polymer 4, was applied over the photoresist patterned substrate and the shrink film had a thickness of 100 nm and was subjected to heat treatment (i.e. mixing bake) at 140° C. for 60 s. Subsequently, the shrink material was removed using DI water puddle for 60 s and rinsed for 60 s. The defect measurement was done using KLA2360 (pixel size 0.25 μm (manufactured by KLA Tencor Co.)) in the exposed and unexposed areas after development. A smudge defect is where the defect is not a particle but an elliptical smudge-like defect on the surface. The same process was followed for the comparative material, where the product AZ® R607 (manufactured by AZ®EM USA Corps, 70, Meister Ave., Somerville, N.J.) was used as the shrink material. The defect data is summarized in Table 5. The results show that particle defects observed were in the acceptable range. The data further showed that there were no smudge defects.

Example 7b

Poly(AMOR/DMAEA/VCL) on ArF Photoresist, AZ AX2050P (90 nm C/H with 180 nm pitch)

An anti-reflective coating material, AZ® ArF-1C5D (manufactured by AZ EM USA Corp., 70, Meister Ave., Somerville, N.J.) was spin coated on a silicon substrate and baked at 200° C. for 60 s to prepare an anti-reflective coating of 0.037 μm in thickness. Then AZ® AX2050P photoresist solution (manufactured by AZEM USA Corps, 70, Meister Ave., Somerville, N.J.) was spin-coated on the bottom anti-reflective coated (B.A.R.C) silicon substrate. The photoresist film was baked at 110° C. for 60 seconds to give a thickness of 0.15 μm. Then the photoresist film was exposed on a 193 nm scanner (numerical aperture of 0.78 and coherence of 0.9) using a 6% attenuated phase shift mask. After exposure, the wafer was post-exposure baked at 110° C. for 60 sec. and developed using AZ®626 MIF Developer (manufactured by AZEM USA Corps, 70 Meister Ave., Somerville, N.J.), for 60 sec., to form a contact hole pattern having a diameter of 90 nm with 180 nm pitch. The photoresist patterns were then observed on a scanning electron microscope.

The shrink coating material made as in Table 3 using Polymer 22b, was applied onto the patterned photoresist and the thickness of the shrink film was 100 nm. The substrate was subjected to heat treatment (i.e. mixing bake) at 150° C. for 60 seconds. Subsequently, the unreacted shrink material was removed using DI water puddle for 60 s and rinse for 30 s. The mixing bake temperature was varied from 160° C.-170° C. for 60 s in order to promote a crosslinking reaction at the interface between the photoresist and shrink layer. Shrinkage is a measure of critical dimension (CD) difference of the contact hole (C/H) or trench before and after the shrink process. The defect data is summarized in Table 5. The data in Table 5 shows that the particle defects observed were in the acceptable range. The data further showed that there were no smudge defects.

TABLE 5

Defectivity Data of RELACS on AX2050P (ArF) 90 nm Contact Hole resist, 180 pitch:

| | | | | Number of Defects | | | |
|---|---|---|---|---|---|---|---|
| Example/ | | | | Exposed | | Unexposed | |
| Mixing Bake | Pattern Size | Photoresist | RELACS | WF1 | WF2 | WF1 | WF2 |
| 140° C./60" | Example 7a 90 nm C/H, 180 pitch | AZ AX2050P (ArF) | polymer 4 (from Table 2) | 6 | 2 | 11 | 4 |
| 130° C./60" | Example 7b 90 nm C/H, 180 pitch | AZ AX2050P (ArF) | R607 | 5 | 0 | 3 | 4 |

TABLE 5-continued

Defectivity Data of RELACS on AX2050P (ArF) 90 nm Contact Hole resist, 180 pitch:

| Example/ Mixing Bake | Pattern Size | Photoresist | RELACS | Number of Defects | | | |
|---|---|---|---|---|---|---|---|
| | | | | Exposed | | Unexposed | |
| | | | | WF1 | WF2 | WF1 | WF2 |
| 150° C./60" | Example 7b 90 nm C/H, 180 pitch | AZ AX2050P (ArF) | polymer 22b (from Table 2) | 2 | 16 | 1 | 3 |
| 170° C./60" | Example 7b 90 nm C/H, 180 pitch | AZ AX2050P (ArF) | polymer 22b (from Table 2) | 13 | 9 | 18 | 11 |

The invention claimed is:

1. An aqueous coating composition for coating a photoresist pattern, comprising a polymer soluble in water and comprising at least one unit with an alkylamino group, where the unit has a structure (1),

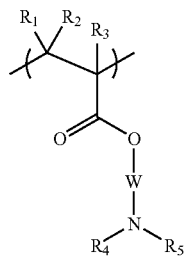

(1)

where, $R_1$ to $R_5$ are independently selected from hydrogen and $C_1$ to $C_6$ alkyl, and W is $C_1$ to $C_6$ alkylene, further where the composition is free of carboxylic acid group.

2. The coating composition of claim 1, where the polymer further comprises a monomeric unit of structure 2,

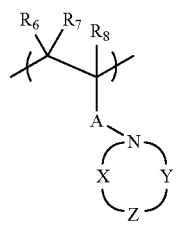

(2)

where, $R_6$ to $R_8$ are independently selected from hydrogen and $C_1$ to $C_6$ alkyl, A is selected from a single bond, O, C(O), (C=O)O, $C_1$ to $C_4$ alkyl;

X, Y, Z and N form a cyclic structure, further where, X is selected from $C_1$ to $C_6$ alkylene, unsaturated $C_1$ to $C_6$ alkylene, direct bond, and mixtures thereof, Y is selected from $C_1$ to $C_6$ alkylene, unsaturated $C_1$ to $C_6$ alkylene, direct bond, and mixtures thereof, Z is selected from O, C(O), and N, and N is nitrogen.

3. The coating composition of claim 2, where the monomeric unit of structure (2) is selected from,

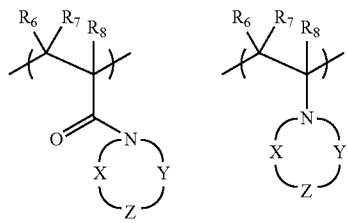

where, $R_6$ to $R_8$ are independently selected from hydrogen and $C_1$ to $C_6$ alkyl, X, Y, Z and N form a cyclic structure, further where, X is selected from $C_1$ to $C_6$ alkylene, unsaturated $C_1$ to $C_6$ alkylene, direct bond, and mixtures thereof, Y is selected from $C_1$ to $C_6$ alkylene, unsaturated $C_1$ to $C_6$ alkylene, direct bond, and mixtures thereof, Z is selected from O, C(O), N and N is nitrogen.

4. The coating composition of claim 2, where the monomeric unit of structure (2) is selected from,

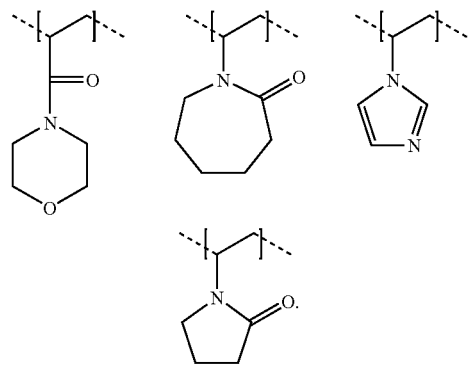

5. The coating composition of claim 1, where W is ethylene.

6. The coating composition of claim 1, where the composition is free of amido group.

7. The coating composition of claim 1, where the polymer is free of amido group.

8. The coating composition of claim 1, where the polymer further comprises a monomeric unit of structure (3),

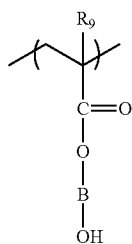

where B is $C_1$ to $C_6$ alkylene, $R_9$ is H or $C_1$ to $C_6$ alkyl.

9. The composition of claim 1, where the composition further contains a water miscible solvent.

10. The composition of claim 1, where the composition further contains a water miscible solvent selected from ($C_1$-$C_8$)alcohols, diols, triols, ketones, esters, lactates, amides, ethylene glycol monoalkyl ethers, ethylene glycol monoalkyl ether acetate, N-methyl pyrrolidone, propylene glycol monomethyl ether, propylene glycol monoethyl ether, propylene glycol monomethyl ether acetate, and propylene glycol monoethyl ether acetate.

11. The composition of claim 1, where the composition further comprises additives selected from surfactant, aminoalcohol, amine, $C_1$-$C_8$alcohol, photoacid generator, crosslinking compound, thermal acid generator, and free acid.

12. The composition of claim 1, where the composition is free of a crosslinking compound.

13. The composition of claim 1, where the composition is free of a photoacid generator.

14. A process for manufacturing a microelectronic device, comprising;
  a) providing a substrate with a photoresist pattern;
  b) coating the photoresist pattern with an aqueous coating composition for coating a photoresist pattern, comprising a polymer comprising at least one unit with an alkylamino group, where the unit has a structure (1),

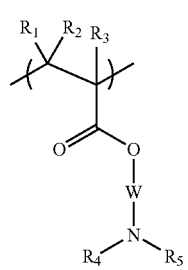

(1)

where, $R_1$ to $R_5$ are independently selected from hydrogen and $C_1$ to $C_6$ alkyl, and W is $C_1$ to $C_6$ alkylene, further where the composition is free of carboxylic acid goup;
  c) reacting a portion of the coating material in contact with the photoresist pattern;
  d) removing a portion of the coating material which is not reacted with a removal solution.

15. The process according to claim 14, where the substrate is heated, thereby causing a reaction of the coating material with the photoresist.

16. The process according to claim 14, where the removal solution is an aqueous solution comprising a hydroxide base.

17. The process according to claim 14, where the removal solution further comprises a water-miscible solvent.

18. The process of claim 14, where the photoresist comprises a polymer and a photoacid generator.

19. An aqueous coating composition for coating a photoresist pattern, comprising a single polymer, where the polymer comprises at least one unit with an alkylamino group of structure (1) and at least one monomeric unit selected from,

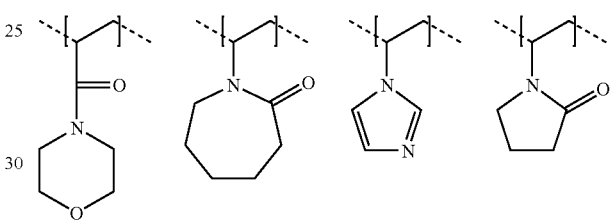

and where structure (1) is,

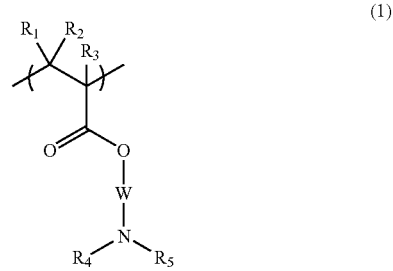

(1)

where, $R_1$ to $R_5$ are independently selected from hydrogen and $C_1$ to $C_6$ alkyl, and W is $C_1$ to $C_6$ alkylene, further where the composition is free of carboxylic acid group.

* * * * *